US 6,545,548 B2

(12) United States Patent
Dinh et al.

(10) Patent No.: US 6,545,548 B2
(45) Date of Patent: Apr. 8, 2003

(54) FRACTIONAL SYNTHESIZER COMPRISING A PHASE JITTER COMPENSATION

(75) Inventors: Huu-Thinh Dinh, Epinay s/Seine (FR); Daniel Peris, Paris (FR); Ghyslain Nadal, Moissy-Cramayel (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/828,230

(22) Filed: Apr. 9, 2001

(65) Prior Publication Data

US 2002/0011901 A1 Jan. 31, 2002

(30) Foreign Application Priority Data

Apr. 11, 2000 (FR) .............................. 00 04644

(51) Int. Cl.[7] .............................................. H03L 7/00
(52) U.S. Cl. .......................................... 331/17; 331/15
(58) Field of Search ..................... 331/17, 15; 327/536, 327/157, 537; 375/371

(56) References Cited

U.S. PATENT DOCUMENTS

| 5,143,636 A | | 9/1992 | Gaucher et al. ............ 252/62.9 |
| 5,184,028 A | * | 2/1993 | Zobel ......................... 327/109 |
| 5,495,206 A | * | 2/1996 | Hietala ....................... 327/105 |
| 5,557,090 A | | 9/1996 | Ganne et al. ................ 235/449 |
| 5,592,120 A | * | 1/1997 | Palmer et al. ............... 327/157 |
| 5,663,686 A | * | 9/1997 | Tada ........................... 327/157 |
| 5,752,175 A | | 5/1998 | Roullet et al. ........... 455/183.1 |
| 5,818,303 A | | 10/1998 | Oishi et al. ................. 331/1 A |
| 6,107,843 A | * | 8/2000 | de Gouy et al. ............ 327/105 |
| 6,130,561 A | * | 10/2000 | Dufour ....................... 327/105 |
| 6,141,394 A | * | 10/2000 | Linebarger et al. ......... 327/157 |
| 6,404,274 B1 | * | 6/2002 | Hosono et al. ............. 327/536 |

FOREIGN PATENT DOCUMENTS

| EP | 147 307 | 7/1985 |
| WO | WO 99/33181 | 7/1999 |
| WO | WO 00/46913 | 8/2000 |

* cited by examiner

*Primary Examiner*—Robert Pascal
*Assistant Examiner*—Joseph Chang
(74) *Attorney, Agent, or Firm*—Oblon, Spivak, McClelland, Maier & Neustadt, P.C.

(57) ABSTRACT

The multiple fractional division frequency synthesizer includes a frequency generator, a voltage-controlled oscillator, a programmable variable N-divider, a phase comparator, an integration and filter circuit, a time window generator, a weighted current source, a phase accumulator, and a charge-pump circuit including plural transistors. The current source is connected to the charge-pump circuit to directly switch currents over to the emitter of one or more of the plural transistors of the charge-pump circuit.

27 Claims, 4 Drawing Sheets

FRACTIONAL SYNTHESIZER COMPRISING A PHASE JITTER COMPENSATION

BACKGROUND OF THE INVENTION

1. Field of the Invention

The invention relates to a synthesizer with fast acquisition time and low phase noise using the principle of fractional division in implementing a technique of compensation for phase jitter suited to low voltage operation and minimum power consumption.

It relates for example to synthesizers working at a low and single voltage of 2.7 V and is compatible with ASIC technology and integration, again for minimum power consumption.

Advantageously, synthesizers of this kind can be used to obtain channel links compatible with radio-telephone equipment, especially equipment complying with the GSM and GPRS norms.

The invention can also be applied in any device integrating a frequency synthesis under constraints of low voltage and minimum power.

2. Description of the Prior Art

The prior art discloses frequency synthesizers having very short frequency acquisition times and very high frequency resolution values. The synthesizer developed by Philips under the catalog reference SA 8025 is an example.

However, the comparison frequencies commonly used are generally not compatible with the spectral characteristics required and cannot be used to obtain the desired acquisition times in a framework of applications operating under low voltage and minimum power.

It has been shown that, in fractional division synthesis, the phase error difference in the phase comparator is proportional to:

the value Pk (dynamic phase error) contained in the phase accumulator, and the period Ts=1/Fs of the synthesized signal Fs.

The value Pk is variable and known at each reference period Tr as well as Fs. If Fr is the reference frequency, it is enough, at each reference period 1/Fr, to prepare a signal proportional at all times to these two quantities in order to compensate for this phase error. Since the phase error is different at each reference cycle, the correction period must be substantially smaller than 1/Fr.

Various approaches have been proposed to minimize or even eliminate the phase jitter lines due to fractional synthesis. One approach consists in carrying out a current weight correction modulated in duration (the compensation signal Ic has both an intensity and a duration that are a function of the value given by a phase accumulator) as described in the patent application FR 2.557.401 by the Applicant. The fractional division synthesizer with low phase jitter described in this patent comprises several current sources that are summated in taking account of the temperature and linearity before being sent to an integrator. The synthesizer comprises an operational amplifier supplied with two high voltages, a positive voltage and a negative voltage and a digital-analog converter or DAC controlling the current sources. The feedback control voltage is sampled by a sample-and-hold circuit before it is sent to the oscillator control.

A device of this kind, although it reduces the phase jitter, cannot be applied to high-speed, low-consumption applications, especially low voltage applications (whether unique or not) such as the GSM.

It is also difficult to apply zero voltage to the summation node of the different current sources, whatever the control voltage of the oscillator and the temperature dissipated in the circuit. Indeed, when the control voltage of the oscillator varies, the voltage at the summation node of the current source also varies because of the lack of precision of the prepositioning. These leads to a modification of the point of operation of the feedback control amplifier which then causes a modification in the correction current.

SUMMARY OF THE INVENTION

The present invention proposes a simple and efficient way of obtaining compensation for phase jitter due to fractional synthesis.

The invention relates to a multiple fractional division frequency synthesizer comprising a frequency generator, a voltage-controlled oscillator, a programmable variable N-divider, a phase comparator, an integration and filter circuit, a time window generator, a weighted current source, a phase accumulator, a charge-pump circuit comprising several transistors.

The invention is characterized in that said current source is connected to said charge-pump circuit so as to directly switch the currents over to the emitter of one or more transistors of the charge-pump circuit.

The synthesizer is, for example, powered by a low voltage substantially equal to 2.7 V.

The charge pump circuit may comprise at least:

a one transistor Q3 whose emitter is connected to a resistor Rc, itself linked with the phase comparator, one transistor Q2 in which there flows the charging current Ic, linked with the integration circuit, and one transistor Q4 having its emitter connected to a resistor Rp connected to the phase comparator and its collector connected to the integration circuit, the discharging current Ip flowing through Rp and Q4, and the weighted current source comprises one or more parallel-mounted resistors R1, R2, R3, said resistor or resistors being connected to the emitter of Q3 and to at least one field-effect transistor Q5, Q6, Q7 receiving, at their gates, the value or values Pk contained in the phase accumulator, the source of the field-effect transistors being linked with the time window generating, during a time Tcor, a low level signal or "0V" signal.

According to another embodiment, the charge-pump circuit comprises for example:

a transistor Q3 whose emitter is connected to a resistor Rc itself linked with the phase comparator, a transistor Q2 in which there flows the charging current Ic, linked with the integration circuit, and a transistor Q4 having its emitter is connected to a resistor Rp linked with the phase comparator and its collector linked with the integration circuit, the discharging current Ip flowing through Rp and Q4, and a transistor Q5 having its base connected to the base of the emitter Q3, its collector linked to the base of Q1 and its emitter linked to a resistor Rcor, the resistor Rcor being linked to the device generating a low-level "0V" signal during a correction time Tcor.

The invention also relates to a fractional division frequency synthesizer with fast acquisition time and low phase noise having at least one of the characteristics given here above.

The invention also relates to a radiocommunications device comprising at least one emitter and one receiver and a fractional division frequency synthesizer comprising at least one of the above characteristics.

The invention also relates to a method for synthesizing a frequency comprising at least one of the following steps:

using a frequency synthesis loop comprising a programmable variable N-divider, a charge-pump circuit, a current source and a time window generator, coupling an output of the current source to said charge-pump circuit in order to directly switch the correction current or currents over to the emitter of at least one of the transistors of the charge-pump circuit, generating a signal from the low-level "0" time window and applying it to the current source during a period ΔTcor.

The method and the device according to the invention can be applied for example in the field of GSM and/or GPRS.

The synthesizer according to the invention has especially the following advantages:

it reduces the phase noise in the passband of the synthesizer by at least 10 dB for constant technology, for example the ASIC technology, it allows the least possible deterioration in the quality of the phase noise delivered at the output of the charge-pump function, it keeps its efficiency throughout the synthesized frequency range, it offers the possibility of using only one power voltage which can drop to 2.7 V.

BRIEF DESCRIPTION OF THE DRAWINGS

Other features and advantages of the invention shall appear from the following description, given by way of an illustration that in no way restricts the scope of the invention, with reference to the appended figures, of which.

MORE DETAILED DESCRIPTION

Figure 1:
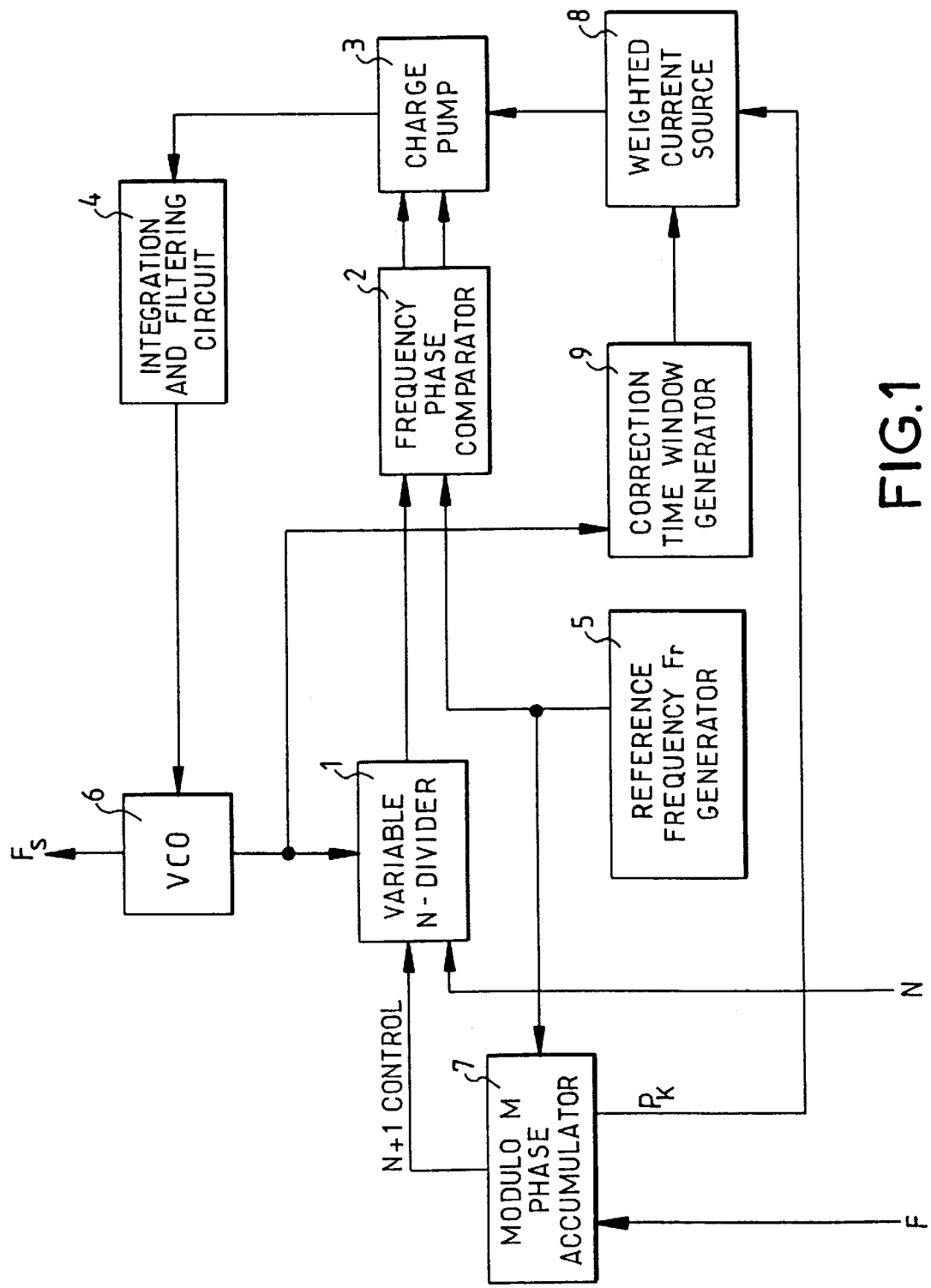
FIG. 1 is a drawing of a synthesizer loop.

FIG. 1 shows a standard synthesizer comprising a variable N-divider 1, followed by a frequency/phase comparator 2, itself followed by a charge-pump stage or circuit 3, an integration and filtering circuit 4 and a voltage-controlled oscillator 6 commonly called a VCO.

It also comprises a reference frequency Fr generator 5 coupled firstly to a frequency/phase comparator 2 and secondly to a modulo M phase accumulator 7 used to obtain the fractional step.

A weighted current source circuit 8 coupled to a correction time window generator 9 corrects the phase jitter.

The function of the different elements constituting the synthesizer is recalled briefly as it is known to those skilled in the art.

The voltage-controlled oscillator 6 gives a frequency signal Fs at an input of the N-divider 1 and at an output of the synthesizer.

The divider 1 has an output giving a reference signal Fs/N to the frequency/phase comparator 2. This comparator 2 also receives the reference signal Fr given by the frequency generator 5. It has two outputs known as the delay channel and the lead channel (FIGS. 2, 3, 4) linked to the charge-pump circuit 3.

The charge-pump circuit 3 is connected to the weighted current source 8 and has an output towards an integration and filtering circuit 4 known to those skilled in the art. This integration circuit carries out an integration on the basis of the charges provided by the charging current Ic and the discharging current Ip and gives a filtered voltage V before being applied to the VCO.

The time window generator 9 receives the synthesized frequency Fs coming from the oscillator VCO at an input and provides the weighted current source 8 with a time slot ΔTcor corresponding to the duration in which the correction has to be made.

Figure 3:
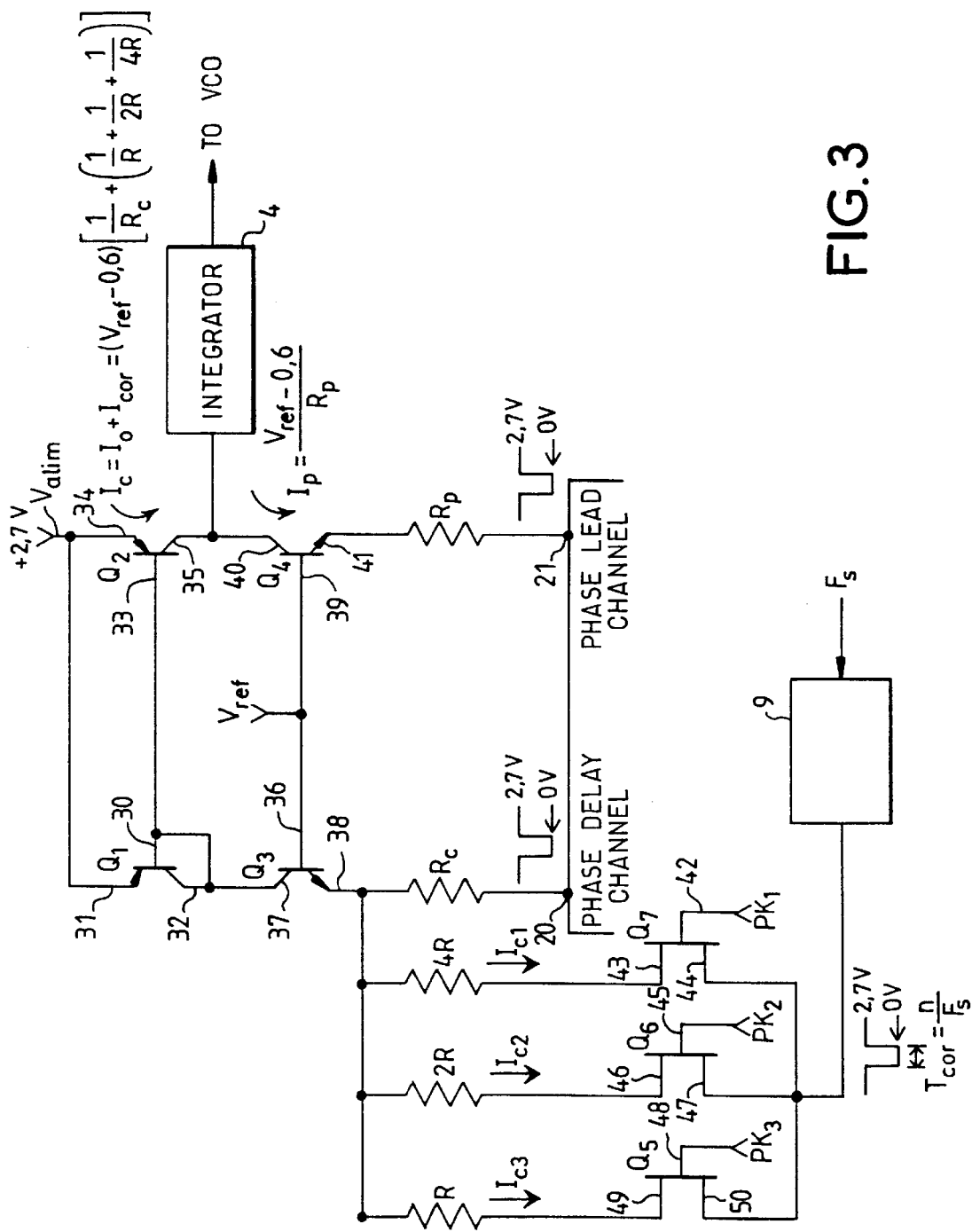
FIG. 3 shows a first exemplary synthesizer according to the invention, and FIG. 4 gives a schematic view of the second exemplary implementation of the invention.
Figure 4:
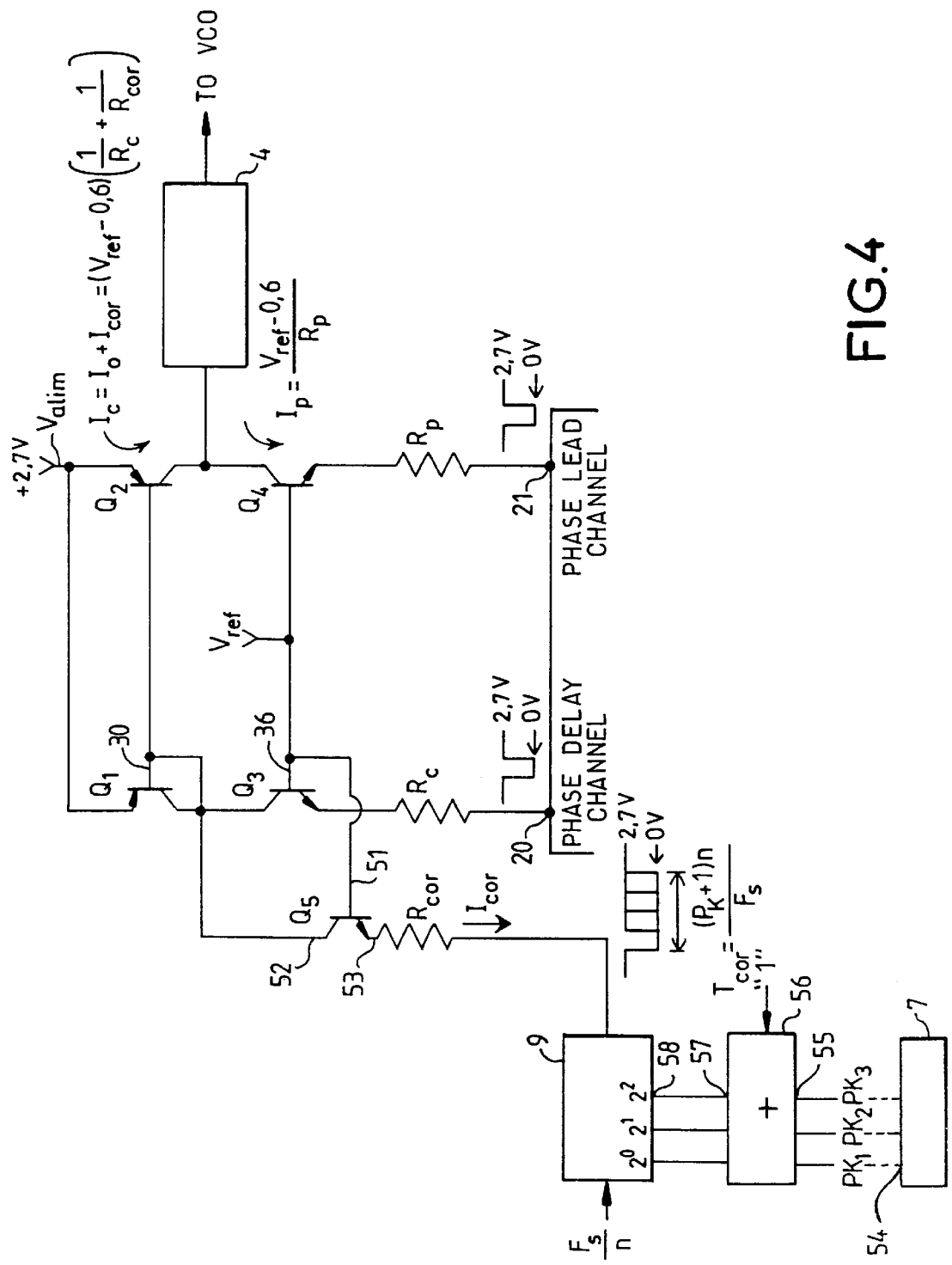

The phase accumulator 7 accumulates the value k*M at a frequency Fr and gives the totalized value Pk to the weighted current source 8 whose operation and two examples of implementation are given in detail with reference to FIGS. 3 and 4.

Principle of Fractional Division

The division rank, according to a relationship computed in real time, sequentially takes one of the values N or N+1 so that the synthesis step is a fractional step that is a sub-multiple of the reference frequency Fr applied to an input of the phase comparator.

The synthesized frequency at the output of the oscillator 6 is obtained by an average, on M cycles, of the reference frequency Fr during which the division is performed F times by the value N+1 and M-F times by the value N.

The expression of Fs is then written as follows:

$$Fs = \left[\frac{(F(N+1)) + (M-F)N}{M}\right] Fr$$

Or again $$Fs = \left[N + \frac{F}{M}\right] Fr \quad (1)$$

With N as the rank of the integer division and F/M being the fractional part of the division, F being an integer such that:

$$0 \leq F < M$$

The smallest frequency increment is obtained by modifying F by one unit and represents the step P of the synthesizer. This step is equal to Fr/M instead of being equal to Fr for a standard frequency synthesis.

The fact of synthesizing the step values that are fractions or multiples of the quantity Fr/M introduces a dynamic phase error Pk at each reference cycle which is expressed by a substantial phase modulation of the signal of the voltage-controlled oscillator. This phase error is conventionally generated and totalized by means of the phase accumulator 7 whose contents are incremented by the value F at each comparison performed by the comparator 2.

The contents Pk of the accumulator thus provide for knowledge of the time phase difference ΔTk existing at any instant k between the loop signal and the reference signal, this difference ΔTk being defined by the relationship:

$$\Delta Tk = Pk/(M*Fs) \quad (2)$$

Since the contents Pk of the accumulator are constantly variable, the relationship (2) shows that there is always a positional modulation of the leading edge of the loop signal Fb in the course of time and that this position is always in a phase lead with respect to the leading edge of the reference signal Fr because the loop signal is actually obtained by a division N instead of N+F/M as indicated by the relationship (1). The phase comparator 2 will therefore generate a signal on the phase lead channel that evolves in time and controls the discharge of the capacitor of the integration of the loop (integration circuit). It is this loss of charge that creates the parasitic lines on the synthesized frequency.

According to the idea of the invention, the phase error Pk contained in the phase accumulator is used to inject a charging current Ic to compensate for the loss of charge due to the fractional division. The charging or discharging of the integrator is obtained by a constant current referenced to a stable reference voltage. The compensation current comes from the charging current Ic. The control voltage V coming from the integrator 4 is sent directly to the control of the oscillator VCO and the controls of the different current sources 8 are activated by digital signals delivered by the phase accumulator 7, without interface.

The control voltage or feedback control voltage applied to the oscillator 6 then remains constant. This gives a pure frequency spectrum at output of the loop or of the synthesizer.

Figure 2:
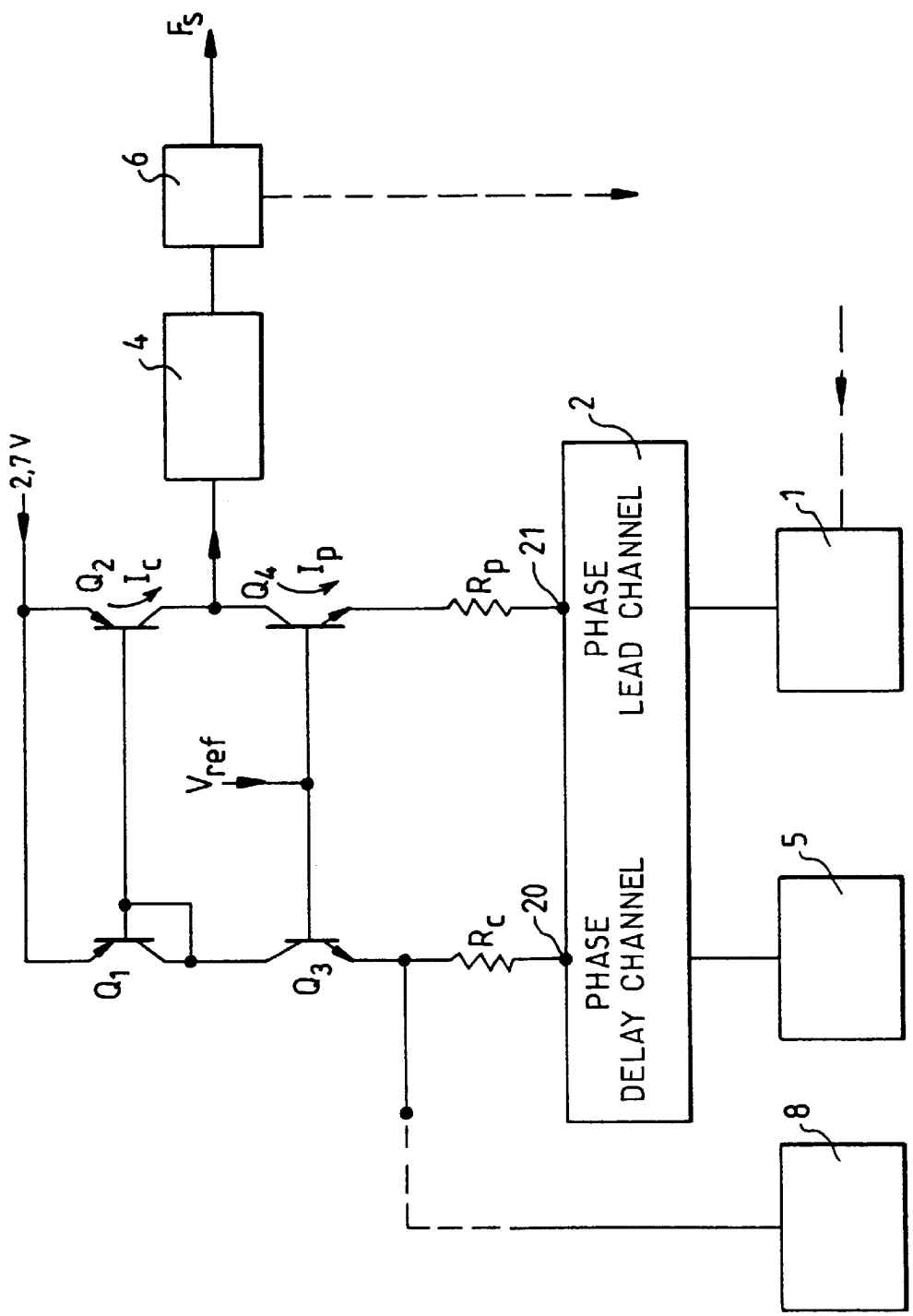
FIG. 2 is a block diagram of the arrangement of the charge-pump circuit and current source included in the synthesizer according to the invention.

The synthesizer according to the invention comprises the elements described in FIG. 1, where the charge-pump circuit 3 and the compensation current source circuit 8 coupled to the generator of the correction time window generator 9 are directly connected according to a drawing described in FIG. 2 and in FIGS. 3 and 4. The unit is powered at a single voltage of 2.7 V considered to be a low voltage.

Through an arrangement of this kind between the different elements of the synthesizer, it is possible especially to convert the phase jitter detected by the phase comparator 2 between the loop signal and the voltage reference signal to achieve a feedback control over the synthesized frequency.

In the presence of the fractional part, the system of compensation of the phase jitter is automatically put into operation, the values of Pk being not zero and directly modifying the charging current of the integration capacitance of the loop.

The charge-pump circuit 3, in this exemplary embodiment, has four transistors Q1, Q2, Q3 and Q4 positioned for example according to the diagram of FIG. 2. The emitters 31, 33 of the transistors Q1 and Q2 are linked with the 2.7 V supply source Valim. Their collectors 32, 35 are respectively connected to the collectors 37, 40 of the transistors Q3 and Q4. The base 30 of Q1 is connected to the base 33 of Q2. The bases 36, 40 of the transistors Q3 and Q4 are connected and biased at a reference voltage Vref. The emitter 38 of the transistor Q3 is connected by means of a resistor Rc to the phase comparator 2 and the emitter 41 of the transistor Q4 is connected through a resistor Rp to the phase comparator 2.

The emitter 38 of the transistor Q3 is also directly linked with the current generator circuit 8 whose architecture is described for example in FIGS. 3 and 4.

The charge-pump circuit 3 works for example as follows;

The loop signal Fb coming from the variable divider 1 and the reference signal Fr coming from the frequency generator 5 are transmitted to the phase/frequency comparator 2.

Three cases can be envisaged:

1) When these two signals Fb and Fr are in phase, the phase delay output 20 and the phase advance output 21 of the phase comparator are at the logic "1" level, namely at a voltage level equal to the supply voltage, in this example 2.7 V. The transistors Q3 and Q4 are off. Since the charging current Ic flows in the transistor Q2 and the integration circuit and the discharging current Ip flows through the integration circuit, the transistor Q4 and the resistor Rp are at zero or substantially at zero. The value of voltage at the terminals of the capacitor of the integration circuit is therefore constant or substantially constant.

2) Should the loop signal Fb be delayed with respect to the reference signal Fr, since the frequency of the oscillator 6 (VCO) is lower than the desired frequency, the phase generator will generate a logic level "0" on the phase delay channel 20. The resistor Rc is then grounded through the phase comparator 2 on this channel. A charging current Ic, substantially equal to (Vref-0.6)/Rc, flows in this resistor Rc and, by current mirror effect, a current with a substantially equal value flows in the collector of the transistor Q2 in order to charge the capacitor of the integration circuit. The increase in the voltage of the integrator, taken for example at the integrator output of the integration circuit, leads to an increase in the frequency of the oscillator 6 until the desired frequency is reached.

3) Should the loop signal Fb be in a phase lead, it is the phase lead channel 21 that will activate the discharge in order to reduce the frequency of the oscillator until equilibrium is reached. The phase comparator generates a logic level at 0 on the phase lead channel and the resistor Rp is connected to the ground through the phase comparator 2 and a discharging current Ip flows through Q4 and the resistor Rp to discharge the capacitor of the integration circuit.

In the presence of the fractional part Fr/M, the phase lead channel still activates a small discharge due to the fractional division at each reference clock stroke. This loss in charge, which is a cause of unwanted lines on the synthesized frequency, must therefore be cancelled. The method according to the invention achieves this cancellation by injecting an equivalent charge according to two alternative embodiments explained here below with reference to FIGS. 3 and 4 chiefly.

First Alternative Embodiment—FIG. 3

The injection of weighted currents is done during a constant or substantially constant time duration.

The weighted currents circuit 8 coupled to the time correction window generator 9 applies a current correction during a time that is proportional to the period Ts=1/Fs of the synthesized signal.

In this exemplary embodiment, the weighted current circuits comprise three resistors R1=4R, R2=2R and R3=R, which for example are parallel-connected. Each of these resistors is linked, firstly, with the emitter 38 of the transistor Q3 and, secondly, with a field-effect transistor respectively referenced Q7, Q6 and Q5. The phase accumulator 7 applies the value of the dynamic phase error Pk1, Pk2, Pk3 to the gates 42, 45, 48 of each of the transistors Q7, Q6, Q5. Their source 44, 47, 50 is biased at a potential delivered by the time window generator 9 which is an n counter for example receiving the synthesized frequency Fs (Fs acts as a clock for the counter), the drain 43, 46, 49 of these transistors being powered by the different currents Ic1, Ic2 and Ic3 flowing in the resistors R1, R2, R3.

When the fractional part is present, the values of Pk given by the modulo M phase accumulator 7 are not zero. Depending on its value, Pk may or may not connect the resistors R1, R2 and R3 to the ground through the counter 9 or n counter in order to obtain the circulation, by current mirror effect, of a correction current Icor towards the integration circuit 4 with Ic=$I_0$+Icor. Icor is the current automatically generated during the correction. $I_0$ is a current that flows when the loop signal $F_o$ is delayed with respect to the reference signal Fr.

This n counter sends a square-wave signal whose low state corresponds to "0V" or low level and whose high state may correspond to 2.7 V. The duration of the low state, Tcor, during which the correction current will flow, is equal or substantially equal to Tcor=n/Fs. This procedure makes it possible to carry out a multiplication between a current and a time, giving a quantity of charge Qcor to be given to the integration circuit 4, defined by Qcor=Icor*Tcor.

Or again:

$$Qcor = (Vref - 0,6)\left[\left(\frac{Pk3}{R} + \frac{Pk2}{2R} + \frac{Pk1}{4R}\right)\frac{C}{Fs}\right]$$

With Pk1; Pk2; Pk3 equal to "0" or "1" and C as a constant chosen as a function of the technology of the counter.

Computation of the Quantity of Energy Lost

It being known that, that at each instant k, the quantity of energy lost Qk is equal to (4):

$$Qk = \left[\left(\frac{Pk}{MFs}\right)Ip\right]$$

With Ip as the discharging current of the charge-pump circuit 3, Pk as the value of the phase error at the instant k, M as the modulo value of the accumulator.

To cancel this loss of charge, the weighed current circuit 8 automatically injects a certain current Icor=Ic1+Ic2+Ic3 to charge the integration capacitor of the loop (the capacitor of the integration circuit described in detail with reference to FIG. 4).

The sum of the injected currents is proportional to the value Pk contained in the phase accumulator and the charging duration is proportional to n times the period Ts of the synthesized signal.

Equilibrium is set up when there is equality between the quantity of charge to be compensated given by the relationship (3) and the quantity of energy lost expressed in the relationship (4). This equilibrium leads to an elementary value Ie for the charging current equal to Ip/(C*M), namely Ie=Ic1 in this exemplary application.

In the case of a fast synthesizer covering the frequency range 3420 to 3840 MHz, for example with a 400 KHz step designed especially for the GSM/GPRS terminals, the reference frequency Fr is chosen for example to be 2 MHz, dictating a modulo M value equal to 5. Pk can take the following values: 0, 1, 2, 3 and 4.

For Pk=0, the phase error is zero.

For Pk=1, the elementary temporary phase jitter varies from 52 to 58.4 picoseconds depending on the synthesized frequency.

In this exemplary application, the correction window Tcor is taken for example to be equal to 40 times the period Ts of the synthesized frequency, giving an elementary value for the charging current Ie equal to Ip/(5*40). Since Pk is a binary 3-bit value, it is necessary to have three binary weighted current sources having respectively binary weight values equal to Ic1=Ie, Ic2=2*Ie and Ic3=4*Ie.

Thus, the switching of the current is as follows:

| Contents of the phase accumulator | Current switched for the discharge of the integration circuit |
| --- | --- |
| Pk = 1 | Ic1 |
| Pk = 2 | Ic2 |
| Pk = 3 | Ic1 and Ic2 |
| Pk = 4 | Ic3 |

FIG. 4 describes another embodiment of variable-time constant current injection.

The charge pump circuit 3, in addition to the elements described in FIG. 3, has a transistor Q5 with its base 51 is connected to the base 36 of the transistor Q3, its collector 52 connected to the base 30 of the transistor Q1 and its emitter 53 connected to the resistor Rcor.

The weighted current circuit has a resistor Rcor connected firstly to the emitter 53 of the transistor Q5 and secondly to the counter 9.

This other procedure makes use of a single correction current source.

Its principle of operation is as follows: the correction current Icor is activated by a simple grounding of the resistor Rcor by the counter 30, whose duration Tcor in the low state "0V" is equal to (Pk+1)*n/Fs for each reference cycle, with Pk corresponding to the value of the phase errors contained in the phase accumulator.

The corresponding charge is equal to Qcor=Icor*((Pk+1) *n/Fs) or again (5):

$$Qcor = \frac{Icor * Pk * n}{Fs} + \frac{Icor * n}{Fs}$$

The relationship (5) shows that, allowing for a constant Icor*n/Fs, the quantity of charge given is identical or substantially identical to the quantity of charge lost Qk of the relationship (4) when Icor=Ip/(n*M).

The currents Ip and Ic flow towards the integration circuit or form the integration circuit according to a principle identical to the one described in FIG. 3.

Without departing from the framework of the invention, the synthesizer described in FIGS. 2 to 4 can be applied to any device powered at low voltage, whether it comes from a single source or from several sources, and for which the consumption power must be minimized.

It can be applied especially to radiocommunications devices comprising an emitter and a receiver and a frequency synthesizer according to the GSM/GPRS standards.

What is claimed is:

1. A multiple fractional division frequency synthesizer, comprising:
    a frequency generator;
    a voltage-controlled oscillator;
    a programmable variable N-divider;
    a phase comparator;
    an integration and filter circuit;
    a time window generator;
    a weighted current source;
    a phase accumulator; and
    a charge-pump circuit comprising plural transistors,
    wherein the weighted current source is connected to the charge-pump circuit to directly switch currents over to an emitter of one or more of the plural transistors of the charge-pump circuit.

2. A frequency synthesizer according to claim 1, powered by a low voltage substantially equal to 2.7 V.

3. A frequency synthesizer according to claim 2, wherein the 2.7 V is provided by a single voltage source.

4. A synthesizer according to claim 2, wherein the currents are switched over during a period substantially equal to a multiple of a correction time window and as a function of value of contents of the phase accumulator.

5. A synthesizer according to claim 3, wherein the currents are switched over during a period substantially equal to a multiple of a correction time window and as a function of a value of contents of the phase accumulator.

6. A synthesizer according to claim 1, wherein the currents are switched over during a period substantially equal to a multiple of a correction time window and as a function of a value of contents of the phase accumulator.

7. A synthesizer according to claim 1, wherein the plural transistors of the charge pump circuit comprise:
 a first transistor whose emitter is connected to a first resistor, the first resistor linked with the phase comparator;
 a second transistor in which a charging current flows, the second transistor linked with the integration circuit; and
 a third transistor having an emitter connected to a second resistor connected to the phase comparator and a collector connected to the integration circuit, a discharging current flowing through the second resistor and the third transistor,
 wherein the weighted current source comprises one or more parallel-mounted resistors, said one or more resistors being connected to the emitter of the first transistor and to at least one field effect transistor receiving, at each gate, a value contained in the phase accumulator, a source of the at least one field-effect transistor being linked with the time window generator, a low-level signal or a 0 V signal during a correction time.

8. A synthesizer according to claim 7, wherein the current generation circuit comprises three resistors R1, R2 et R3, parallel-mounted such that R3=R, R2=2R and R1=4R.

9. A synthesizer according to claim 8, wherein Tcor=n/Fs and $$Icor = \frac{Ip}{n*M}.$$

10. A frequency synthesizer according to claim 1, wherein the plural transistors of the charge-pump circuit comprise:
 a first transistor whose emitter is connected to a first resistor, the first resistor linked with the phase comparator;
 a second transistor in which a charging current flows, the second transistor linked with the integration circuit;
 a third transistor having an emitter connected to a second resistor connected to the phase comparator and a collector connected to the integration circuit, a discharging current flowing through the second resistor and the third transistor; and
 a fourth transistor having a base connected to the base of an emitter, a collector linked to the base of a fifth transistor, and an emitter linked to a third resistor, the third resistor being connected to a device generating a low-level 0 V signal during a correction time.

11. A synthesizer according to claim 10, wherein the duration Tcor is equal to (Pk+1)*n/Fs.

12. A fractional division synthesizer with fast acquisition time and low phase noise according to claim 1.

13. A radiocommunications device comprising at least one emitter and one receiver and one fractional division frequency synthesizer according to one of the claims 1 to 12.

14. A frequency synthesizing method, comprising:
 using a frequency synthesis loop comprising a programmable variable N-divider, a charge-pump circuit including plural transistors, a weighted current source, and a time window generator;
 coupling an output of the weighted current source to the charge-pump circuit to directly switch currents over to an emitter of at least one of the plural transistors of the charge-pump circuit; and
 generating a signal from a low-level voltage source and applying the signal to the current source during a correction period.

15. A method according to claim 14, wherein the duration $$Tcor = \frac{n}{F_s}$$

and $$Icor = \frac{I_p}{n*M},$$

n being a characteristic of the counter of the time window.

16. A method according to claim 14 wherein $$Tcor = \frac{(P_k + 1)}{n*F_s}.$$

17. A method according to claim 14, wherein a low voltage supply substantially equal to 2.7 V is used.

18. An application of the synthesizer according to claim 1 to frequency synthesis for GSM and/or GPRS type applications.

19. An application of the method according to claim 14 to frequency synthesis for GSM and/or GPRS type applications.

20. A multiple fractional division frequency synthesizer comprising:
 a frequency generator;
 a voltage-controlled oscillator;
 a programmable variable N-divider;
 a phase comparator;
 an integration and filter circuit;
 a time window generator;
 a weighted current source;
 a phase accumulator; and
 a charge-pump circuit comprising plural transistors, wherein said current source is connected to said charge-pump circuit to directly switch currents over to an emitter of one or more of the plural transistors of the charge-pump circuit,
 powered by a low voltage substantially equal to 2.7 V.

21. A frequency synthesizer according to claim 20, wherein the 2.7 V is provided by a single voltage source.

22. A synthesizer according to claim 20, wherein the currents are switched over during a period substantially equal to a multiple of a correction time window and as a function of a value of contents of the phase accumulator.

23. A synthesizer according to claim 21, wherein the currents are switched over during a period substantially equal to a multiple of a correction time window and as a function of a value of contents of the phase accumulator.

24. A frequency synthesizing method comprising:

using a frequency synthesis loop comprising a programmable variable N-divider, a charge-pump circuit including plural transistors, a current source, and a time window generator, coupling an output of the current source to said charge-pump circuit in order to directly switch correction currents over to an emitter of at least one of the plural transistors of the charge-pump circuit, generating a signal from a low-level voltage input and applying the signal to the current source during a correction period Tcor, wherein a duration $$Tcor = \frac{n}{F_s} \quad \text{and} \quad Icor = \frac{I_p}{n*F_s},$$

n being a characteristic of the counter of the time window.

25. A method according to claim 24, wherein $$Tcor = \frac{(P_k + 1)}{n*F_s}.$$

26. A method according to claim 24, wherein a low voltage supply substantially equal to 2.7 V is used.

27. A method according to claim 25, wherein a low voltage supply substantially equal to 2.7 V is used.

* * * * *

UNITED STATES PATENT AND TRADEMARK OFFICE
CERTIFICATE OF CORRECTION

PATENT NO. : 6,545,548 B2
DATED : April 8, 2003
INVENTOR(S) : Dinh et al.

It is certified that error appears in the above-identified patent and that said Letters Patent is hereby corrected as shown below:

<u>Title page, Item [54] and Column 1, lines 1 and 2,</u>
Should read: -- [54] FRACTIONAL SYNTHESIZER COMPRISING A PHASE JITTER COMPENSATION DEVICE --

Signed and Sealed this

Nineteenth Day of August, 2003

JAMES E. ROGAN
*Director of the United States Patent and Trademark Office*